(12) United States Patent
Zheng et al.

(10) Patent No.: US 12,402,515 B2
(45) Date of Patent: Aug. 26, 2025

(54) QUANTUM DOT DISPLAY PANEL AND MANUFACTURING METHOD THEREOF AND DISPLAY DEVICE

(71) Applicant: Shenzhen China Star Optoelectronics Semiconductor Display Technology Co., Ltd., Shenzhen (CN)

(72) Inventors: Ziming Zheng, Shenzhen (CN); Hongying Pan, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/769,732

(22) PCT Filed: Mar. 22, 2022

(86) PCT No.: PCT/CN2022/082142
§ 371 (c)(1),
(2) Date: Apr. 16, 2022

(87) PCT Pub. No.: WO2023/159707
PCT Pub. Date: Aug. 31, 2023

(65) Prior Publication Data
US 2024/0407230 A1    Dec. 5, 2024

(30) Foreign Application Priority Data
Feb. 22, 2022  (CN) .......................... 202210161304.0

(51) Int. Cl.
*H10K 59/80*    (2023.01)
*H10K 59/12*    (2023.01)
(Continued)

(52) U.S. Cl.
CPC ....... *H10K 59/873* (2023.02); *H10K 59/1201* (2023.02); *H10K 59/122* (2023.02); *H10K 50/115* (2023.02); *H10K 59/878* (2023.02)

(58) Field of Classification Search
CPC ............. H10K 50/115; H10K 59/1201; H10K 59/122; H10K 59/38; H10K 59/40;
(Continued)

(56) References Cited

U.S. PATENT DOCUMENTS

2021/0074770 A1    3/2021  Choe
2021/0328168 A1*   10/2021 Park .................... H10K 59/8792
(Continued)

FOREIGN PATENT DOCUMENTS

CN    105182601 A    12/2015
CN    106773306 A    5/2017
(Continued)

OTHER PUBLICATIONS

International Search Report in International application No. PCT/CN2022/082142, mailed on Nov. 29, 2022.
(Continued)

*Primary Examiner* — Brook Kebede
(74) *Attorney, Agent, or Firm* — Nathan & Associates Patent Agents Ltd.; Menachem Nathan

(57) ABSTRACT

A quantum dot display panel, a manufacturing method thereof, and a display device, which relate to the field of display technology, are provided. In a technical solution provided by the present application, a quantum dot light-emitting layer in a traditional method is transferred from a side of a color filter cover plate to a side of an array substrate, thereby reducing an impact of an alignment deviation caused by an alignment process between the cover plate and the array substrate on the quantum dot light-emitting layer. At the same time, because a pixel definition region is
(Continued)

a closed shape formed inside the encapsulation layer, the encapsulation film layer can be omitted on the color filter cover of the quantum dot display panel, thereby achieving a purpose of simplifying manufacturing process.

17 Claims, 3 Drawing Sheets

(51) Int. Cl.
*H10K 59/122* (2023.01)
*H10K 50/115* (2023.01)

(58) Field of Classification Search
CPC ...... H10K 59/50; H10K 59/60; H10K 59/873; H10K 59/878
See application file for complete search history.

(56) References Cited

U.S. PATENT DOCUMENTS

| | | | | |
|---|---|---|---|---|
| 2021/0391389 | A1* | 12/2021 | Ryu | H10K 59/878 |
| 2021/0391390 | A1* | 12/2021 | Yoon | H10K 50/858 |
| 2022/0344406 | A1* | 10/2022 | Kim | H01L 25/0753 |

FOREIGN PATENT DOCUMENTS

| | | |
|---|---|---|
| CN | 108922906 A | 11/2018 |
| CN | 109560115 A | 4/2019 |
| CN | 208970563 U | 6/2019 |
| CN | 110265586 A | 9/2019 |
| CN | 113809128 A | 12/2021 |
| CN | 113809130 A | 12/2021 |

OTHER PUBLICATIONS

Written Opinion of the International Search Authority in International application No. PCT/CN2022/082142, mailed on Nov. 29, 2022.
Chinese Office Action issued in corresponding Chinese Patent Application No. 202210161304.0 dated Apr. 19, 2025, pp. 1-6.

\* cited by examiner

QUANTUM DOT DISPLAY PANEL AND MANUFACTURING METHOD THEREOF AND DISPLAY DEVICE

FIELD OF INVENTION

The present application relates to the technical field of display panels, and in particular, to a quantum dot display panel, a manufacturing method thereof, and a display device.

BACKGROUND OF INVENTION

Quantum dot light-emitting diodes (QDLED) is recognized by an industry as the most promising display device due to its advantages of high brightness, wide color gamut, long life, and high internal quantum efficiency. In a currently quantum dot light-emitting display panel, the light-emitting layer needs to be printed on the color filter cover, and then precisely aligned with the sub-pixels on the array substrate by vacuum lamination equipment. However, the alignment accuracy of the equipment is limited, and the alignment deviation is likely to cause problems such as color mixing. Both an array substrate and a color filter cover need to perform an encapsulating process, which increases a difficulty of product manufacturing.

SUMMARY OF INVENTION

A technical problem to be solved by the present application is to provide a quantum dot display panel, which can reduce an influence caused by an alignment deviation.

The technical solution adopted by the present application for solving the above-mentioned technical problems is:

In a first aspect, the present application provides a quantum dot display panel, including:
  an array substrate;
  a light-emitting layer disposed on the array substrate;
  an encapsulation layer disposed on the array substrate, and a pixel definition region in a closed shape is formed inside the encapsulation layer; and
  a quantum dot light-emitting layer disposed in the pixel definition region to emit light when excited by light of the light-emitting layer.

Optionally, in some embodiments of the present application, the encapsulation layer is disposed on a side of the light-emitting layer facing away from the array substrate.

Optionally, in some embodiments of the present application, further including a reflective layer, wherein the encapsulation layer is disposed on the side of the array substrate facing away from the light-emitting layer, and wherein the reflective layer is disposed on a side of the array substrate facing away from the light-emitting layer, and the reflective layer is disposed to reflect the light emitted by the light-emitting layer to the quantum dot light-emitting layer.

Optionally, in some embodiments of the present application, the reflective layer is a cathode layer electrically connected to the light-emitting layer.

Optionally, in some embodiments of the present application, a thickness of the cathode layer is greater than 2000 Å.

Optionally, in some embodiments of the present application, the encapsulation layer includes multiple layers of sub-encapsulation layers stacked in sequence, and wherein a side of the sub-encapsulation layer facing an adjacent one of the sub-encapsulation layers is a contact surface, and wherein at least one of the contact surfaces of the sub-encapsulation layers is recessed to form the pixel definition region.

Optionally, in some embodiments of the present application, at least two of the pixel definition regions are formed on a same contact surface.

Optionally, in some embodiments of the present application, further including a light shielding layer disposed in the encapsulation layer, and wherein the light shielding layer covers at least an inner sidewall of the pixel definition region and exposes a terminal of the pixel definition region facing the light-emitting layer.

Optionally, in some embodiments of the present application, the pixel definition region is in a shape that gradually shrinks from a cross section of the contact surface.

Optionally, in some embodiments of the present application, the multiple layers of the sub-encapsulation layers include a first sub-encapsulation layer, a second sub-encapsulation layer, and a third sub-encapsulation layer which are stacked in sequence, wherein the pixel definition region is formed on the contact surface of the second sub-encapsulation layer facing the third sub-encapsulation layer.

Optionally, in some embodiments of the present application, the multi-layers of the sub-encapsulation layers further includes a fourth sub-encapsulation layer, and wherein the fourth sub-encapsulation layer is disposed on a side of the third sub-encapsulation layer facing away from to the second sub-encapsulation layer.

Optionally, in some embodiments of the present application, the pixel definition region includes at least a first pixel definition region, a second pixel definition region, and a third pixel definition region, and wherein the first pixel definition region, the second pixel definition region, and the third pixel definition region are respectively disposed on different contact surfaces.

Optionally, in some embodiments of the present application, further including a light-shielding layer disposed on the contact surface and between two adjacent pixel definition regions and configured to block light between the two adjacent pixel definition regions.

In a second aspect, the present application provides a display device including the quantum dot display panel as described in the first aspect.

In a third aspect, the present application provides a method of manufacturing a quantum dot display panel, including:
  providing an array substrate, wherein a light-emitting layer is disposed on the array substrate; and
  providing an encapsulation layer on the array substrate, wherein a pixel definition region in a closed shape is formed inside the encapsulation layer, and wherein a quantum dot light-emitting layer is disposed in the pixel definition region.

Optionally, in some embodiments of the present application, the step of providing the encapsulation layer on the array substrate including:
  providing multiple layers of sub-encapsulation layers stacked in sequence on the array substrate, wherein a side of the sub-encapsulation layer facing an adjacent one of the sub-encapsulation layers is a contact surface;
  providing the pixel definition region on the contact surface of at least one layer of the sub-encapsulation layers; and
  providing a quantum dot light-emitting layer in the pixel definition region.

Optionally, in some embodiments of the present application, before the quantum dot light-emitting layer is arranged in the pixel definition region, the method further including:

providing a light-shielding material on the contact surface; and patterning the light-shielding material to form a light-shielding layer, wherein the light shielding layer covers at least a part of an inner sidewall of the pixel definition region and exposes a terminal of the pixel definition region facing the light-emitting layer.

Compared with the prior art, the present application has the following advantages:

In the technical solution provided in the present application, a quantum dot light-emitting layer in a traditional method is transferred from a side of a color filter cover plate to a side of an array substrate, thereby reducing an impact of an alignment deviation caused by an alignment process between the cover plate and the array substrate on the quantum dot light-emitting layer. At the same time, because a pixel definition region is a closed shape formed inside the encapsulation layer, the encapsulation film layer can be omitted on the color filter cover of the quantum dot display panel, thereby achieving a purpose of simplifying manufacturing process.

DESCRIPTION OF FIGURES

In order to more clearly illustrate the embodiments of the present application or the technical solutions in the prior art, the following briefly introduces the accompanying figures that need to be used in the embodiments. The figures in the following description are only part of the embodiments of the present application, and for those of ordinary skill in the art, other figures can also be obtained according to these figures without inventive steps.

DETAILED DESCRIPTION OF EMBODIMENTS

The technical solutions in the embodiments of the present application will be clearly and completely described below with reference to the figures in the embodiments of the present application. Obviously, the described embodiments are only a part of the embodiments of the present application, rather than all the embodiments. Based on the embodiments in the present application, all other embodiments obtained by those skilled in the art without inventive steps shall fall within a protection scope of the present application.

In the description of the present application, it should be understood that the terms "center", "longitudinal", "lateral", "length", "width", "thickness", "upper", "lower", "front", "rear", "left", "right", "vertical", "horizontal", "top", "bottom", "inside", "outside", etc. indicate an orientation or positional relationship based on the orientation or position shown in the figures. The relation is only for a convenience of describing the present application and simplifying the description, rather than indicating or implying that the device or element referred to must have a unique orientation, be constructed and operated with a specific orientation, and therefore cannot be interpreted as a limitation to the present application. In addition, the terms "first" and "second" are only used for descriptive purposes, and should not be understood as indicating or implying relative importance or indicating the number of indicated technical features. Thus, a feature defined as "first", "second" may explicitly or implicitly include one or more features. In the description of the present application, "plurality" means two or more, unless otherwise expressly and specifically defined.

In the present application, the word "exemplary" is used to mean "serving as an example, illustration, or description.". Any embodiment described in the present application as "exemplary" is not necessarily to be construed as preferred or advantageous over other embodiments. The following description is presented to enable any person skilled in the art to make and use the present application. In the following description, details are set forth for a purpose of explanation. It is to be understood that one of ordinary skill in the art can realize that the present application may be practiced without the use of these specific details. In other instances, well-known structures and procedures have not been described in detail so as not to obscure a description of the present application with unnecessary detail. Thus, the present application is not intended to be limited to the embodiments shown but is to be accorded a widest scope consistent with principles disclosed herein.

Embodiment 1

Figure 1:
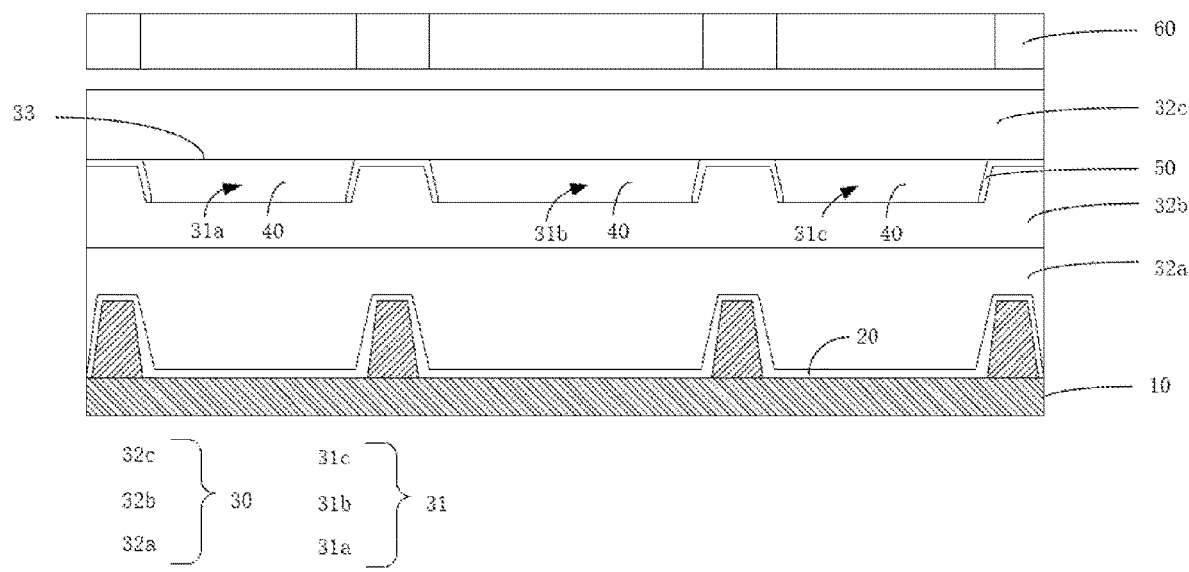
FIG. 1 is a schematic structural diagram of a quantum dot display panel in embodiment 1 provided by the present application.
Figure 2:
FIG. 2 is a schematic diagram of the steps of providing an array substrate in embodiment 1 provided by the present application.
Figure 3:
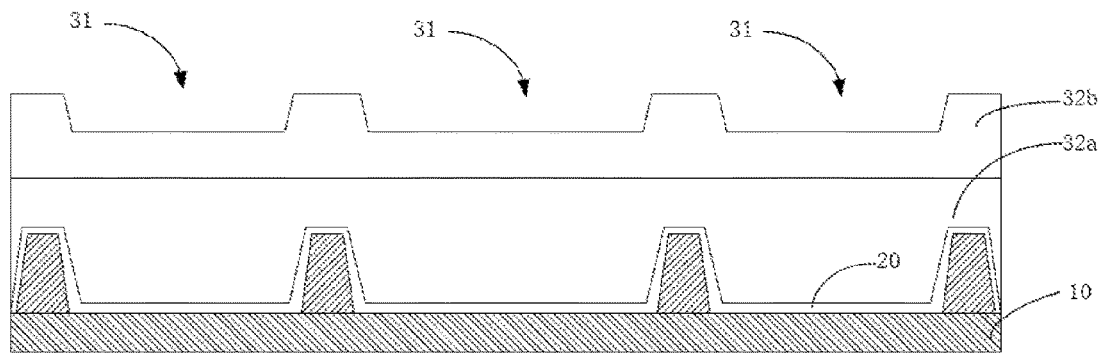
FIG. 3 is a schematic diagram of steps of disposing a first sub-encapsulation layer and a second sub-encapsulation layer on an array substrate and forming a pixel definition region in embodiment 1 provided by the present application.
Figure 4:
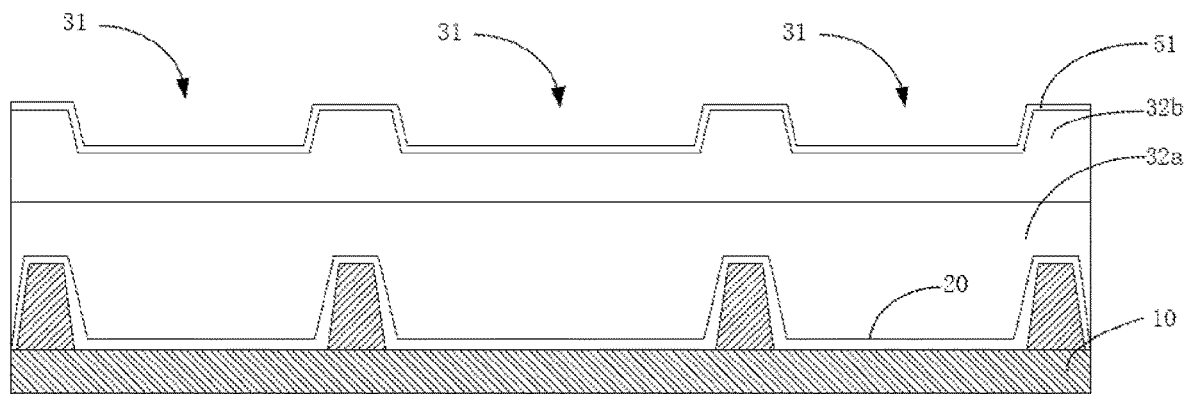
FIG. 4 is a schematic diagram of steps of disposing a light-shielding material on the array substrate in embodiment 1 provided by the present application.
Figure 5:
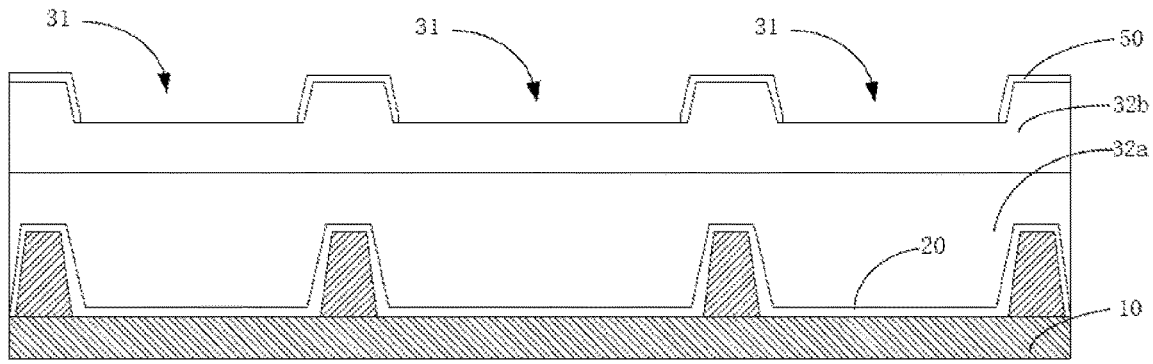
FIG. 5 is a schematic diagram of the steps of patterning the light-shielding material in embodiment 1 provided by the present application.
Figure 6:
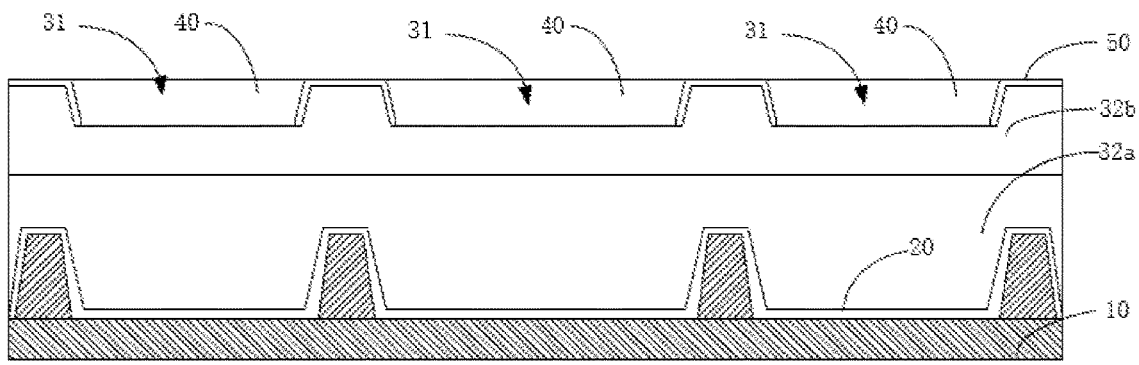
FIG. 6 is a schematic diagram of the steps of disposing a quantum dot light-emitting layer in a pixel definition region in embodiment 1 provided by the present application.

Referring to FIG. 1, a main body of the present embodiment is a quantum dot display panel, specifically a top emission quantum dot display panel. In this embodiment, the quantum dot display panel includes:

an array substrate 10;

a light-emitting layer 20 disposed on the array substrate 10;

an encapsulation layer 30 disposed on the array substrate 10, and a pixel definition region 31 in a closed shape is formed inside the encapsulation layer 30; and a quantum dot light-emitting layer 40 disposed in the pixel definition region 31 to emit light when excited by light of the light-emitting layer 20.

The technical solution provided in this embodiment mainly transfers the quantum dot light-emitting layer 40 in the traditional method from a side of the color filter cover 60 to a side of the array substrate 10. Specifically, in the encapsulation layer 30 of the array substrate 10, therefore an influence of the alignment deviation caused by the alignment process between the cover plate and the array substrate 10 on the quantum dot light-emitting layer 40 is avoided. At the same time, because the pixel definition region 31 presents a closed shape formed inside the encapsulation layer 30. Therefore, the encapsulating film layer can be omitted on the color filter cover plate 60 of the quantum dot display panel, thereby achieving a purpose of simplifying the process. Further, after the quantum dot light-emitting layer 40 and the light-emitting layer 20 are disposed on the array substrate 10 at the same time, a light intensity of the light-emitting layer 20 received by the quantum dot light-emitting layer 40 can be improved, thereby reducing an energy conversion loss during the excitation process, to increase the brightness of the device.

It should be noted that the above-mentioned light-emitting layer 20 is used to emit light of a specific wavelength, and these light rays pass through the encapsulation layer 30 and enter the quantum dot light-emitting layer 40 to excite the quantum dot light-emitting layer 40, so that the quantum dot light-emitting layer 40 emits light. In this embodiment, the above-mentioned light-emitting layer 20 is mainly used for emitting blue light, that is, the light-emitting layer 20 is a blue light source. Correspondingly, the quantum dot light-emitting layer 40 at least includes at least a red quantum dot light-emitting layer corresponding to the first pixel definition area 31a and a green quantum dot light-emitting layer corresponding to the second pixel definition area 31b. The red quantum dot light-emitting layer and the green quantum dot light-emitting layer are both manufactured from quantum dot materials, so under an excitation by the light-emitting layer 20, the display panel can present red, green, blue and other colors composed of the three primary colors of red, green and blue, and realize color filtering. Of course, the above quantum dot light-emitting layer 40 may also be other quantum dot light-emitting layers. For example, in another embodiment, the quantum dot light-emitting layer 40 is a white quantum dot light-emitting layer, which is used to emit white light under the excitation of the light-emitting layer 20. On a premise that a purpose of the present application is not affected, the implementation personnel can make improvements to the specific implementation manners of the light-emitting layer 20 and the quantum dot light-emitting layer 40, which are not particularly limited in the present application.

It should also be noted that the above-mentioned light-emitting layer 20 is not limited to the single-layer whole surface shape shown in the present embodiment, and it can also be composed of light-emitting devices, as long as it can emit light to excite the corresponding quantum dot light-emitting layer 40. That is, the present application does not specifically limit this. It can be understood here that, in this embodiment, an entire cathode layer 21 (not shown in FIG. 1) is also formed between the encapsulation layer 30 and the light-emitting layer 20, and the cathode layer 21 is used to connect with the light-emitting layer 20. The cathode layer 21 is disposed to be thinner, so that light of the light-emitting layer 20 can pass through. At the same time, the quantum dot display panel also includes a color filter cover plate 60, wherein color resist in the color filter cover plate 60 is used to align with the quantum dot light-emitting layer 40 in the corresponding pixel definition region 31, and the blue color resist can be replaced by transparent color resist.

The quantum dot display panel provided in this embodiment is a top-emission quantum dot display panel, that is, the encapsulation layer 30 is disposed on a side of the light-emitting layer 20 facing away from the array substrate 10. In addition to encapsulating the quantum dot light-emitting layer 40, the encapsulation layer 30 also encapsulates the light emitting layer 20. Due to the quantum dot light-emitting layer 40 and the light emitting layer 20 share the encapsulation layer 30, thus saving a disposing of the encapsulation layer 30 and reducing a cost of the encapsulation layer 30, while reducing a thickness of the film layer of the product, and realizing a thinning of the product. The above-mentioned encapsulation layer 30 and the pixel definition region 31 thereof can be manufactured by the implementer using the currently encapsulation film layer to encapsulate the light-emitting layer 20 in the quantum dot display panel.

It can be understood that the above-mentioned encapsulation layer 30 may have a single-layer structure, but when the encapsulation layer 30 adopts a single-layer structure, it will increase a difficulty of manufacturing the pixel definition region 31. Accordingly, in this embodiment, the encapsulation layer 30 includes multiple layers of sub-encapsulation layers stacked in sequence, and wherein a side of the sub-encapsulation layer facing an adjacent one of the sub-encapsulation layers is the contact surface 33, and wherein there is at least one of the contact surfaces 33 of the sub-encapsulation layers is recessed to form the pixel definition region 31.

By disposing the encapsulation layer 30 into a multi-layer structure, the difficulty of forming the pixel definition region 31 can be reduced. In detail, because the encapsulation layer 30 is a stacked structure, after each sub-encapsulation layer is manufactured, a manufacturing process such as photolithography can be performed on a side of the sub-encapsulation layer facing away from the array substrate 10 to form the pixel definition region 31. It should be noted here that, please further refer to FIG. 1, the above-mentioned contacting surface 33 should not be understood as the side of the sub-encapsulation layer facing away from a side of the array substrate 10, but may also be a side of the sub-encapsulation layer facing a side of the array substrate 10. As long as the contact surface 33 is a side of the sub-encapsulation layer facing an adjacent sub-encapsulation layer, the pixel definition region 31 can be disposed in a closed shape.

It can be understood that the number of the above-mentioned pixel definition regions 31 is generally multiple. A color mixing problem of each pixel definition region 31 needs to be considered when the colors of light emitting by the quantum dot light-emitting layers 40 arranged in the pixel definition regions 31 are different from each other. Therefore, in this embodiment, the light-shielding layer 50 is further included. The light-shielding layer 50 is disposed in the encapsulation layer 30. The light-shielding layer 50 covers at least both sides of an inner sidewalls of the pixel definition region 31 and exposes a terminal of the pixel definition region 31 facing the light-emitting layer 20. In this embodiment, the light shielding layer 50 is mainly provided on the inner sidewall of the pixel definition region 31 to avoid side light mixing and light emission crosstalk of each quantum dot light-emitting layer 40. More specifically, in this embodiment, the light shielding layer 50 covers the contact surface 33 where the pixel definition region 31 is located. A purpose of this arrangement is that the light shielding layer 50 can directly form a black matrix after being patterned by a photolithography process pattern. It should be noted here that the above-mentioned terminal portion refers to a part where the pixel definition region 31 directly points to the light-emitting layer 20 as a virtual component, and is configured to be exposed without being covered by the light-shielding layer 50, so that the pixel definition region 31 is not covered by the light-shielding layer 50, therefore the quantum dot light-emitting layer 40 can receive light from the light-emitting layer 20. In addition, through the above arrangement, the color filter cover plate 60 in the quantum dot display panel can be as shown in this embodiment: the color filter cover plate 60 omits a light shielding member, thereby achieving a purpose of expanding color resist and increasing effective light-emitting region.

For the above-mentioned pixel definition region 31, a cross-sectional shape of the pixel definition region 31 may be a trapezoid, a rectangle, or a combination of the two, which is not particularly limited in the present application. In this embodiment, a cross section of the pixel definition region 31 is in a shape that gradually shrinks from the contact surface 33. That is, the inner sidewall of the pixel definition region 31 extends obliquely in a positive direction. Compared with the technical solution in which the inner sidewall of the pixel definition region 31 is in a shape of extending straight along a positive direction, the light shielding layer 50 can be easily deposited on the inner sidewall of the pixel definition region, and the deposition effect of the light shielding layer 50 is more ideal, which is especially suitable for the case where the light shielding layer 50 adopts a photoresist coating process.

For a specific structure of the above-mentioned multi-layer sub-encapsulation layer, please refer to FIG. 1 again. In this embodiment, the above-mentioned sub-encapsulation layer specifically includes a first sub-encapsulation layer 32a, a second sub-encapsulation layer 32b, and a third sub-encapsulation layer 32c, which are stacked in sequence. The pixel definition region 31 is formed on the contact surface 33 of the second sub-encapsulation layer 32b facing the third sub-encapsulation layer 32c, in detail, the first sub-encapsulation layer 32a and the third sub-encapsulation layer 32c are barrier film layers, and the second sub-encapsulation layer 32b is a buffer film layer to facilitate a formation of the pixel definition region 31. In this embodiment, the first sub-encapsulation layer 32a, the second sub-encapsulation layer 32b, and the third sub-encapsulation layer 32c are all formed by printing. Of course, without affecting the purpose of the invention, the implementer can also improve the structure and manufacturing process of the above-mentioned encapsulation layer 30. For example, in another embodiment, the multi-layer sub-encapsulation layer further includes a fourth sub-encapsulation layer, and the fourth sub-encapsulation layer may be a buffer film layer. The fourth sub-encapsulation layer is disposed on a side of the third sub-encapsulation layer 32c facing away from the second sub-encapsulation layer 32b, in order to improve water and oxygen barrier properties of the quantum dot light-emitting layer 40. In this embodiment, the first sub-encapsulation layer 32a, the second sub-encapsulation layer 32b, the third sub-encapsulation layer 32c, and the fourth sub-encapsulation layer are deposited and formed.

In addition, as described above, the light-emitting layer 20 is used for emitting blue light, the first pixel definition region 31a is used for disposing the first quantum dot light-emitting layer, and the second pixel definition region 31b is used for disposing the second quantum dot light-emitting layer. On a basis of the above content, a third quantum dot light-emitting layer in the third pixel definition region 31c can be vacated, and no quantum dot particles are arranged. The above-mentioned first pixel definition region 31a, second pixel definition region 31b, and third pixel definition region 31c may be disposed on the same contact surface 33 as shown in this embodiment.

In another embodiment, the first pixel definition region 31a, the second pixel definition region 31b, and the third pixel definition region 31c are respectively disposed on different contact surfaces 33, so that the first quantum dot light-emitting layer, the second quantum dot light-emitting layer, and the third quantum dot light-emitting layer are arranged in split layers. The purpose of this arrangement is: due to the first quantum dot light-emitting layer, the second quantum dot light-emitting layer, and the third quantum dot light-emitting layer are generally deposited by solution, during printing or during a spin coating solution deposition, the organic solution corresponding to the quantum dot light-emitting layer 40 can be completely prevented from overflowing into a wrong pixel definition region 31.

In addition, for the pixel definition regions 31 arranged in different layers, the light shielding layer 50 can be further improved to further avoid an occurrence of mixed color cross-light in the quantum dot light-emitting layers 40 in two adjacent pixel definition regions 31. In detail, in this embodiment, the light shielding layer 50 is disposed on the contact surface 33 and between two adjacent pixel definition regions 31 to block light between two adjacent pixel definition regions 31. At the same time, due to the light shielding layer 50 is directly deposited on the contact surface 33 between two adjacent pixel definition regions 31, it is easier to be deposited than the solution in which the light shielding layer 50 is formed on the inner sidewall of the pixel definition region 31. In this embodiment, the light shielding layer 50 can omit the portion covering the inner sidewall of the pixel definition region 31.

It should be noted here that, in this embodiment, the quantum dot light-emitting layer 40 is deposited by printing ink, but this does not represent a limitation on the manufacturing process of the quantum dot light-emitting layer 40. On the premise that the purpose of the invention of the present application is not affected, those skilled in the art can also make improvements to the forming method of the quantum dot light-emitting layer 40.

The manufacturing method of the quantum dot display panel provided in this embodiment will be further described below. Please refer to FIGS. 2 to 6, the manufacturing method provided by this embodiment includes the steps:

S1, providing an array substrate 10, and the light-emitting layer 20 is disposed on the array substrate 10;

S2, disposing an encapsulation layer 30 on the array substrate 10, wherein a closed-shaped pixel definition region 31 is formed inside the encapsulation layer 30, and a quantum dot light-emitting layer 40 is disposed in the pixel definition region 31.

More specifically, regarding step S2, it includes:

S21, disposing a multi-layered sub-encapsulation layer on the array substrate 10, wherein a side of the sub-encapsulation layer facing an adjacent sub-encapsulation layer is the contact surface 33;

S22, disposing a pixel definition region 31 on the contact surface 33 of at least one sub-encapsulation layer;

S23, disposing the quantum dot light-emitting layer 40 in the pixel definition region 31.

As described above, the encapsulation layer 30 in step S21 can be formed by printing or deposition method, and the pixel definition region 31 in step S22 can be formed by other forming processes such as photolithography.

In addition, before the step of disposing the quantum dot light-emitting layer 40 in step S23, the manufacturing method also includes steps:

S24, disposing the light-shielding material 51 on the contact surface 33;

S25, patterning the light-shielding material 51 to form the light-shielding layer 50. The light-shielding layer 50 covers at least the inner sidewall of the pixel definition region 31 and exposes a terminal of the pixel definition region 31 facing the light-emitting layer 20.

The above-mentioned light-shielding layer 50 may be formed by patterning the light-shielding material 51 through a photoresist coating or a photolithography process. On the premise that the purpose of the invention is not affected, the implementer can also choose other patterning steps.

Embodiment 2

Figure 7:
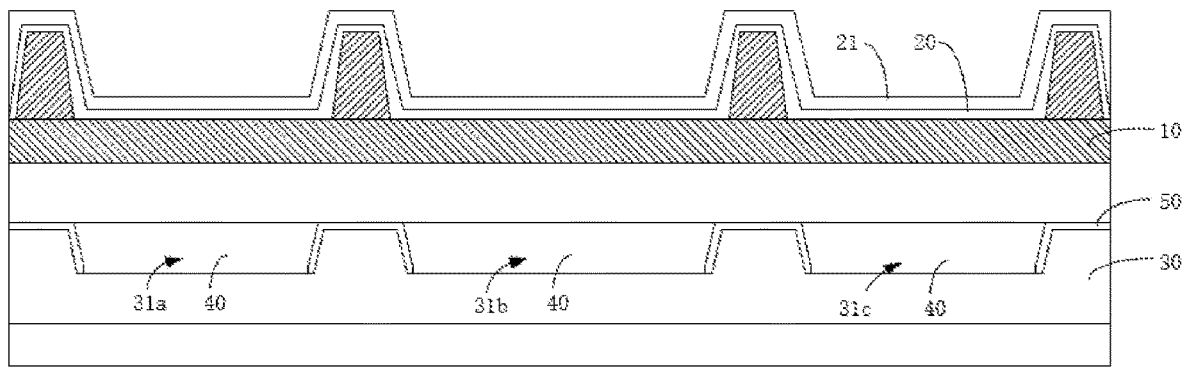
FIG. 7 is a schematic structural diagram of a quantum dot display panel in embodiment 2 provided by the present application.

The main body of embodiment 2 is a quantum dot display panel, specifically a bottom-emission quantum dot display panel. Please refer to FIG. 7, the main differences between this embodiment and the technical solution provided by embodiment 1 are:

The embodiment further includes a reflective layer, the encapsulation layer 30 is arranged on a side of the array substrate 10 facing away from the light-emitting layer 20, the reflective layer is arranged on a side of the light-emitting layer 20 facing away from the array substrate 10, and the reflective layer is configured to reflect the light emitted by the light-emitting layer 20 to the quantum dot light-emitting layer 40, so that the light emitted by the quantum dot light-emitting layer 40 can be emitted from a bottom of the panel.

The purpose of adopting the above structure is to enable the quantum dot display panel to realize bottom emission, and at the same time, due to there is a high temperature process (eg, the process of the light-shielding layer) when the encapsulation layer 30 is fabricated, the encapsulation layer 30 and the light-emitting layer 20 are separated by the array substrate 10. The separation can effectively prevent the subsequent high temperature process from affecting the light-emitting layer 20. More specifically, in this embodiment, a cathode layer 21 disposed between the light-emitting layer 20 and the encapsulation layer 30 is configured to be thicker, for example, its thickness is more than 2000 Å, so that currently components are used to form the reflective layer. Of course, the implementer can also set a thicker metal layer on the side of the cathode layer 21 facing away from the light-emitting layer 20 to form a reflective layer independent of the cathode layer 21. It is worth noting that, at this time, an insulating layer needs to be arranged between the metal layer and the cathode layer 21. In addition, it is also worth mentioning that when the cathode layer 21 is used as the reflective layer, the implementer can add an additional layer of encapsulation film on a side of the reflective layer facing away from the light-emitting layer 20 to protect the light-emitting layer 20 and prevent it is damaged in the subsequent process.

Embodiment 3

The main body of embodiment 3 is a display device, including a quantum dot display panel, and the display device can be any display device such as a tablet, a mobile phone, a computer monitor, a VR device, and the like. The quantum dot display panel can be the quantum dot display panel described in any one of embodiment 1 or embodiment 2, and the implementer can choose correspondingly according to their own needs.

The basic concept has been described above. Obviously, for those skilled in the art, the above detailed disclosure is only an example, and does not constitute a limitation to the present application. Although not explicitly described herein, various modifications, improvements, and corrections to the present application may occur to those skilled in the art. Such modifications, improvements, and corrections are suggested in the present application, so such modifications, improvements, and corrections still fall within the spirit and scope of the exemplary embodiments of the present application.

Meanwhile, the present application uses specific words to describe the embodiments of the present application. Such as "one embodiment," "an embodiment," and/or "some embodiments" means a certain feature, structure, or characteristic associated with at least one embodiment of the present application. Therefore, it should be emphasized and noted that two or more references to "an embodiment" or "one embodiment" or "an alternative embodiment" in various places in this specification are not necessarily referring to the same embodiment. Furthermore, certain features, structures or characteristics of the one or more embodiments of the present application may be combined as appropriate.

Similarly, it should be noted that, in order to simplify the expressions disclosed in the present application and thus help the understanding of one or more embodiments of the present application, in the foregoing description of the embodiments of the present application, various features are sometimes combined into one embodiment, in the figures or descriptions thereof. However, this method of disclosure does not imply that the subject matter of the application requires more features than those mentioned in the claims. Indeed, there are fewer features of one embodiment than all of the features of a single embodiment disclosed above.

Some embodiments use numbers to describe quantities of ingredients and attributes, it should be understood that such numbers used to describe the examples, in some examples, use the modifiers "about", "approximately" or "substantially" to retouch. Unless stated otherwise, "about", "approximately" or "substantially" means that a variation of ±% is allowed for a number. Accordingly, in some embodiments, the numerical parameters set forth in the specification and claims are approximations that can vary depending upon the desired characteristics of individual embodiments. In some embodiments, the numerical parameters should take into account the specified significant digits and use a general digit reservation method. Not withstanding that the numerical fields and parameters used in some embodiments of the present application to confirm the breadth of their ranges are approximations, in particular embodiments such numerical values are set as precisely as practicable.

Each patent, patent application, patent application publication, and other material, such as an article, book, specification, publication, document, etc., cited in the present application is hereby incorporated by reference into the present application in its entirety, but not identical to the content of the present application. Except for inconsistent or conflicting application history documents, documents (currently or hereafter appended to this application) limiting the broadest scope of the claims of the present application are also excluded. It should be noted that, if there is any inconsistency or conflict between the descriptions, definitions, and/or use of terms in the attached materials of the present application and the content of the present application, the descriptions, definitions and/or use of terms in the present application shall prevail.

What is claimed is:

1. A quantum dot display panel, comprising:
   an array substrate;
   a light-emitting layer disposed on the array substrate;
   an encapsulation layer disposed on the array substrate, wherein at least one pixel definition chamber is formed inside the encapsulation layer, and the pixel definition chamber is enclosed by the encapsulation layer; and a quantum dot light-emitting layer embedded within the pixel definition chamber to emit light when excited by light of the light-emitting layer, wherein the quantum dot light-emitting layer is wrapped by the encapsulation layer.

2. The quantum dot display panel according to claim 1, wherein the encapsulation layer is disposed on a side of the light-emitting layer facing away from the array substrate.

3. The quantum dot display panel according to claim 1, further comprising a reflective layer, wherein the encapsulation layer is disposed on a side of the array substrate facing away from the light-emitting layer, the reflective layer is disposed on a side of the light-emitting layer facing away from the array substrate, and the reflective layer is configured to reflect the light emitted by the light-emitting layer to the quantum dot light-emitting layer.

4. The quantum dot display panel according to claim 3, wherein the reflective layer is a cathode layer electrically connected to the light-emitting layer.

5. The quantum dot display panel according to claim 4, wherein a thickness of the cathode layer is greater than 2000 Å.

6. The quantum dot display panel according to claim 1 wherein the encapsulation layer comprises a plurality of sub-encapsulation layers stacked in sequence, the plurality of sub-encapsulation layers comprise contact surfaces, each of the contact surfaces is a surface of a corresponding one of the plurality of sub-encapsulation layers facing an adjacent one of the plurality of sub-encapsulation layers, and the pixel definition chamber is recessed from at least one of the contact surfaces.

7. The quantum dot display panel according to claim 6, wherein at least two pixel definition chambers are formed inside the encapsulation layer, and the at least two pixel definition chambers are formed on a same one of the contact surfaces.

8. The quantum dot display panel according to claim 7, further comprising a light shielding layer disposed inside the encapsulation layer, wherein the light shielding layer at least covers inner sidewalls of the pixel definition chambers and exposes inner bottom walls of the pixel definition chambers facing the light-emitting layer.

9. The quantum dot display panel according to claim 8, wherein a cross section of each of the pixel definition chambers is in a shape that gradually shrinks from a corresponding one of the contact surfaces.

10. The quantum dot display panel according to claim 6, wherein the plurality of sub-encapsulation layers comprise a first sub-encapsulation layer, a second sub-encapsulation layer, and a third sub-encapsulation layer which are stacked in sequence, and the pixel definition chamber is formed on one of the contact surfaces corresponding to the second sub-encapsulation layer facing the third sub-encapsulation layer.

11. The quantum dot display panel according to claim 10, wherein the plurality of sub-encapsulation layers further comprise a fourth sub-encapsulation layer, and the fourth sub-encapsulation layer is disposed on a side of the third sub-encapsulation layer facing away from the second sub-encapsulation layer.

12. The quantum dot display panel according to claim 6, wherein the pixel definition chamber comprises a first pixel definition chamber, a second pixel definition chamber, and a third pixel definition chamber, and the first pixel definition chamber, the second pixel definition chamber, and the third pixel definition chamber are respectively disposed on different ones of the contact surfaces.

13. The quantum dot display panel according to claim 12, further comprising a light-shielding layer disposed on the contact surfaces and between adjacent ones of the first pixel definition chamber, the second pixel definition chamber, and the third pixel definition chamber, wherein the light-shielding layer is configured to block light between the adjacent ones of the first pixel definition chamber, the second pixel definition chamber, and the third pixel definition chamber.

14. A display device, comprising the quantum dot display panel according to claim 1.

15. A method of manufacturing a quantum dot display panel, comprising:
providing an array substrate, wherein a light-emitting layer is disposed on the array substrate; and
providing an encapsulation layer on the array substrate, wherein a pixel definition chamber is formed inside the encapsulation layer, the pixel definition chamber is enclosed by the encapsulation layer, a quantum dot light-emitting layer is embedded within the pixel definition chamber, and the quantum dot light-emitting layer is wrapped by the encapsulation layer.

16. The method of manufacturing the quantum dot display panel according to claim 15, wherein a step of providing the encapsulation layer on the array substrate comprises:
providing a plurality of sub-encapsulation layers stacked in sequence on the array substrate, wherein the plurality of sub-encapsulation layers comprise contact surfaces, each of the contact surfaces is a surface of a corresponding one of the plurality of sub-encapsulation layers facing an adjacent one of the plurality of sub-encapsulation layers;
providing the pixel definition chamber on at least one of the contact surfaces, wherein the pixel definition chamber is recessed from at the least one of the contact surfaces; and
providing the quantum dot light-emitting layer in the pixel definition chamber.

17. The method of manufacturing the quantum dot display panel according to 16, wherein before a step of providing the quantum dot light-emitting layer in the pixel definition chamber, the method further comprises:
providing a light-shielding material on the contact surfaces; and
patterning the light-shielding material to form a light-shielding layer, wherein the light shielding layer covers at least a part of an inner sidewall of the pixel definition chamber and exposes an inner bottom wall of the pixel definition chamber facing the light-emitting layer.

\* \* \* \* \*